(12) United States Patent
Yen et al.

(10) Patent No.: US 9,543,334 B2
(45) Date of Patent: Jan. 10, 2017

(54) DISPLAY PANEL

(71) Applicant: InnoLux Corporation, Miao-Li County (TW)

(72) Inventors: Chung-Wen Yen, Miao-Li County (TW); Hsing-Yi Liang, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/750,170

(22) Filed: Jun. 25, 2015

(65) Prior Publication Data

US 2016/0204124 A1    Jul. 14, 2016

(30) Foreign Application Priority Data

Jan. 13, 2015 (TW) .............................. 104101041 A

(51) Int. Cl.
| | |
|---|---|
| G02F 1/136 | (2006.01) |
| H01L 27/12 | (2006.01) |
| H01L 27/32 | (2006.01) |
| G02F 1/1368 | (2006.01) |
| G02F 1/1335 | (2006.01) |

(52) U.S. Cl.
CPC .......... *H01L 27/124* (2013.01); *G02F 1/1368* (2013.01); *G02F 1/133514* (2013.01); *H01L 27/3276* (2013.01)

(58) Field of Classification Search
CPC ...................................................... H01L 27/124
USPC ............................................................ 349/43
See application file for complete search history.

(56) References Cited

U.S. PATENT DOCUMENTS

| | | | | |
|---|---|---|---|---|
| 6,768,534 B2 * | 7/2004 | Iwase | ................. | H01L 51/5237 313/505 |
| 6,919,933 B2 * | 7/2005 | Zhang | ............... | G02F 1/136227 257/71 |
| 2003/0107687 A1 * | 6/2003 | Choo | ................ | G02F 1/133707 349/39 |

* cited by examiner

*Primary Examiner* — Lucy Chien
(74) *Attorney, Agent, or Firm* — McClure, Qualey & Rodack, LLP

(57) ABSTRACT

A display panel is provided. The display panel includes a substrate including a non-display region containing a thin film transistor, which includes a semiconductor layer; a first insulating layer; a first metal layer; a second insulating layer; a first and second via hole series disposed adjacent to the respective opposite sides of the first metal layer. The first via hole series includes a plurality of first via holes, and the second via hole series includes a plurality of second via holes. A second metal layer includes a first portion and a second portion. The minimum distance between an edge of the first portion and an edge of the first metal layer is a first distance, and the minimum distance between an edge of the second portion and another edge of the first metal layer is a second distance, and the second distance is greater than the first distance.

18 Claims, 7 Drawing Sheets

DISPLAY PANEL

CROSS REFERENCE TO RELATED APPLICATIONS

This application claims priority of Taiwan Patent Application No. 104101041, filed on Jan. 13, 2015, the entirety of which is incorporated by reference herein.

BACKGROUND

Technical Field

The disclosure relates to a thin film transistor and a display panel containing the thin film transistor, and in particular to a thin film transistor with a metal layer and a display panel containing the thin film transistor.

Description of the Related Art

Display devices are becoming more widely used as the display elements of various products. Liquid-crystal molecules have different light polarization or light refraction effects at different alignment configurations, and the liquid-crystal display devices utilize this characteristic to control light penetration and generate images. Conditional twisted nematic liquid-crystal display devices have good light penetration characteristics. However, they cannot provide a sufficient aperture ratio or viewing angle due to their pixel design and structure, and the optical characteristics of the liquid-crystal molecules.

In order to solve this problem, various liquid-crystal display devices with wide-angle viewing and high aperture ratios have been developed, such as the in-plane switching liquid-crystal display device, and the fringe-field switching liquid-crystal display device. However, these liquid-crystal display devices may have poor reliability and short product life cycles.

Therefore, a display device which improves reliability and product life cycle is needed.

SUMMARY

The present disclosure provides a display panel, including a substrate and a thin film transistor. The substrate includes a display region and a non-display region adjacent to the display region. The thin film transistor is disposed on the non-display region of the substrate. The thin film transistor includes a semiconductor layer, a first insulating layer, a first metal layer, a second insulating layer, a first via hole series, a second via hole series, and a second metal layer. The semiconductor layer is disposed over the substrate. The first insulating layer is disposed over the semiconductor layer. The first metal layer is disposed over the first insulating layer second insulating layer is disposed over the first insulating layer. The first via hole series and the second via hole series are disposed adjacent to the respective opposite sides of the first metal layer. The first via hole series includes a plurality of first via holes. The second via hole series includes a plurality of second via holes. The plurality of first via holes and the plurality of second via holes are defined by a sidewall of the first insulating layer, a sidewall of the second insulating layer, and a surface of the semiconductor layer. The second metal layer is disposed over the second insulating layer. The second metal layer includes a first portion and a second portion. The first portion is electrically connected to the semiconductor layer through the plurality of first via holes. The second portion is electrically connected to the semiconductor layer through the plurality of second via holes. The minimum distance between the edge of the first portion and the edge of the first metal layer is a first distance. The minimum distance between the edge of the second portion and another edge of the first metal layer is a second distance. The second distance is greater than the first distance.

The present disclosure also provides a display panel, including a color filter substrate and a liquid crystal layer disposed between the substrate and the color filter substrate.

The present disclosure also provides a display panel, including an upper substrate and an organic light-emitting layer disposed between the substrate and the upper substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
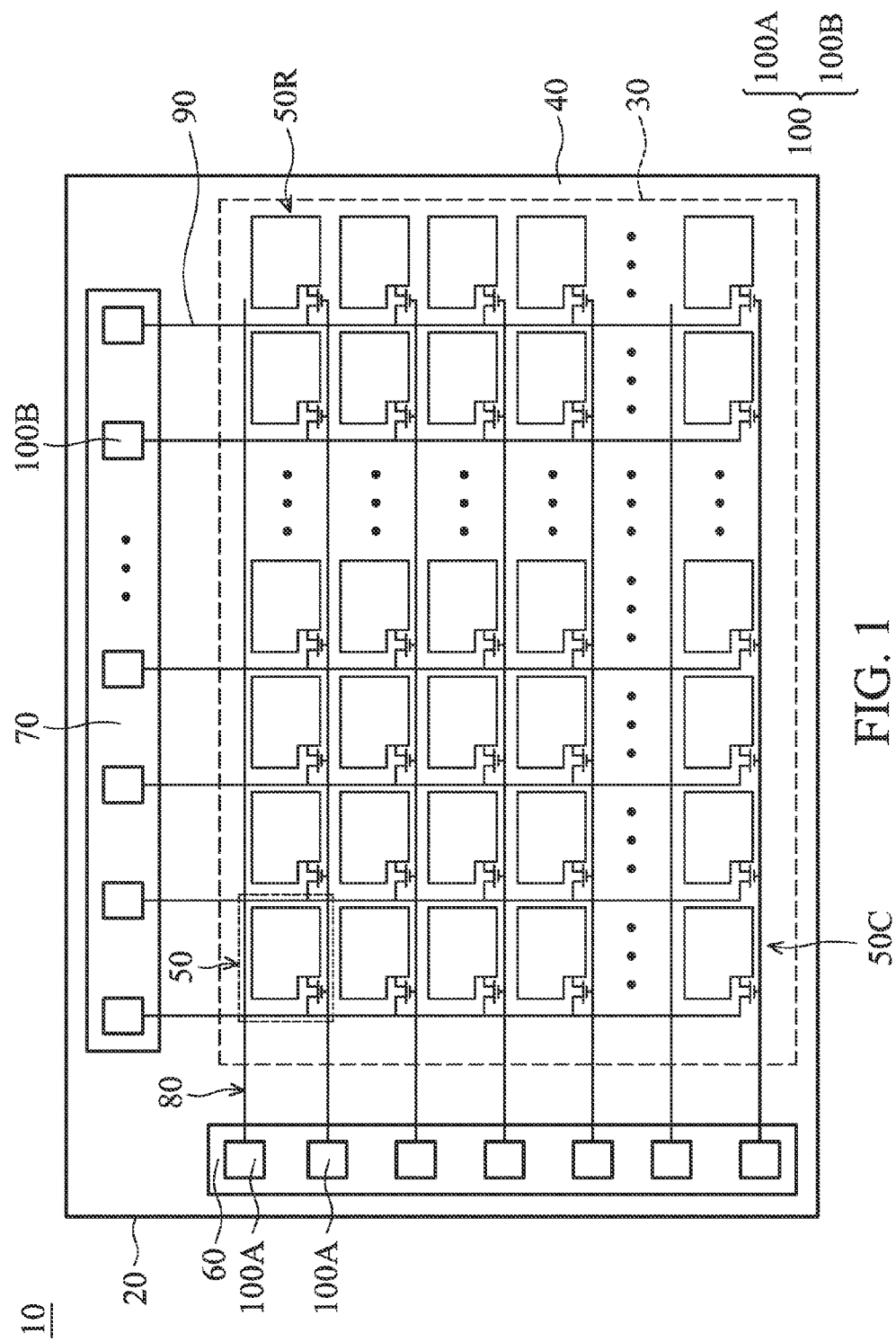
FIG. 1 is a top view of a thin film transistor substrate in accordance with some embodiments of the present disclosure.

The thin film transistor of the present disclosure and the display panel containing the thin film transistor are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first insulating bump disposed on/over a second material layer", may indicate the direct contact of the first insulating bump and the second material layer, or it may indicate a non-contact state with one or more intermediate layers between the first insulating bump and the second material layer. In the above situation, the first insulating bump may not directly contact the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer directly contacts the other layer, or that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills and the background or the context of the present disclosure, and should not be interpreted in an idealized or overly formal manner unless so defined.

In some embodiments of the present disclosure, the distance between source and gate of the thin film transistor is different from that between drain and gate such that the reliability and product lifespan of the display device may be improved.

FIG. 1 is a top view of a thin film transistor substrate 10 in accordance with some embodiments of the present disclosure. As illustrated in FIG. 1, the thin film transistor substrate 10 includes substrate 20. The substrate 20 may include, but is not limited to, a transparent substrate such as a glass substrate, a ceramic substrate, a plastic substrate, or any other suitable transparent substrate. In addition, the substrate 20 includes a display region 30 and a non-display region 40 adjacent to the display region 30. The display region 30 refers to the region in the thin film transistor substrate 10 in which the pixel including transistor is disposed and displays. The transistor may include, but is not limited to, a thin film transistor. The non-display region 40 refers to the region other than the display region 30 in the thin film transistor substrate 10. In this embodiment, the non-display region 40 surrounds or encloses the display region 30.

As shown in FIG. 1, a plurality of sub-pixels 50 is disposed in the display region 30, and the gate-driving circuit 60 and the source-driving circuit 70 are disposed on the non-display region 40. The gate-driving circuit 60 may provide a scanning pulse signal to the sub-pixels 50 in the display region 30, and the source-driving circuit 70 may provide a source signal to the sub-pixels 50 in the display region 30 and control each sub-pixel 50 in the display region 30 in coordination with the aforementioned scanning pulse signal to display an image.

In particular, at least one active element 100 may be disposed in the gate-driving circuit 60 and at least one active element 100 may be disposed in the source-driving circuit 70. For example, the active elements 100A are disposed in the gate-driving circuit 60 and the active elements 100B are disposed in the source-driving circuit 70. The active element 100 may include, but is not limited to, a thin film transistor. When displaying image, one active element 100A disposed in the gate-driving circuit 60 provides the scanning pulse signal to the plurality of sub-pixels 50 at the same time through one wire 80. For example, the active element 100A provides the scanning pulse signal to all the sub-pixels 50 in the sub-pixel row 50R at the same time. In addition, one active element 100B disposed in the source-driving circuit 70 provides the source signal to the plurality of sub-pixels 50 at the same time through one wire 90. For example, the active element 100B provides the source signal to all the sub-pixels 50 in the sub-pixel column 50C at the same time.

Figure 2A:
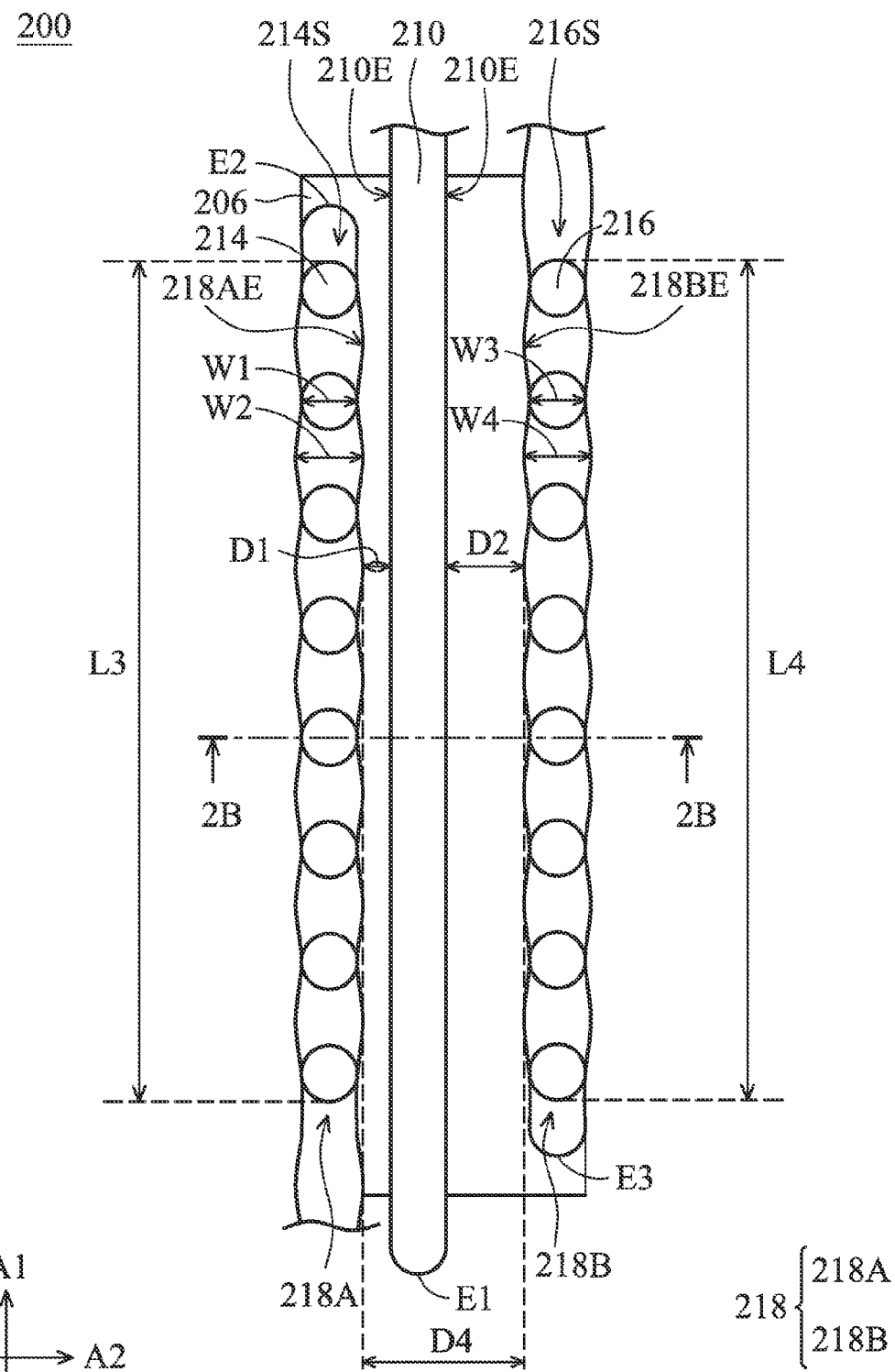
FIG. 2A is a top view of an active element disposed on the non-display region in accordance with some embodiments of the present disclosure.
Figure 2B:
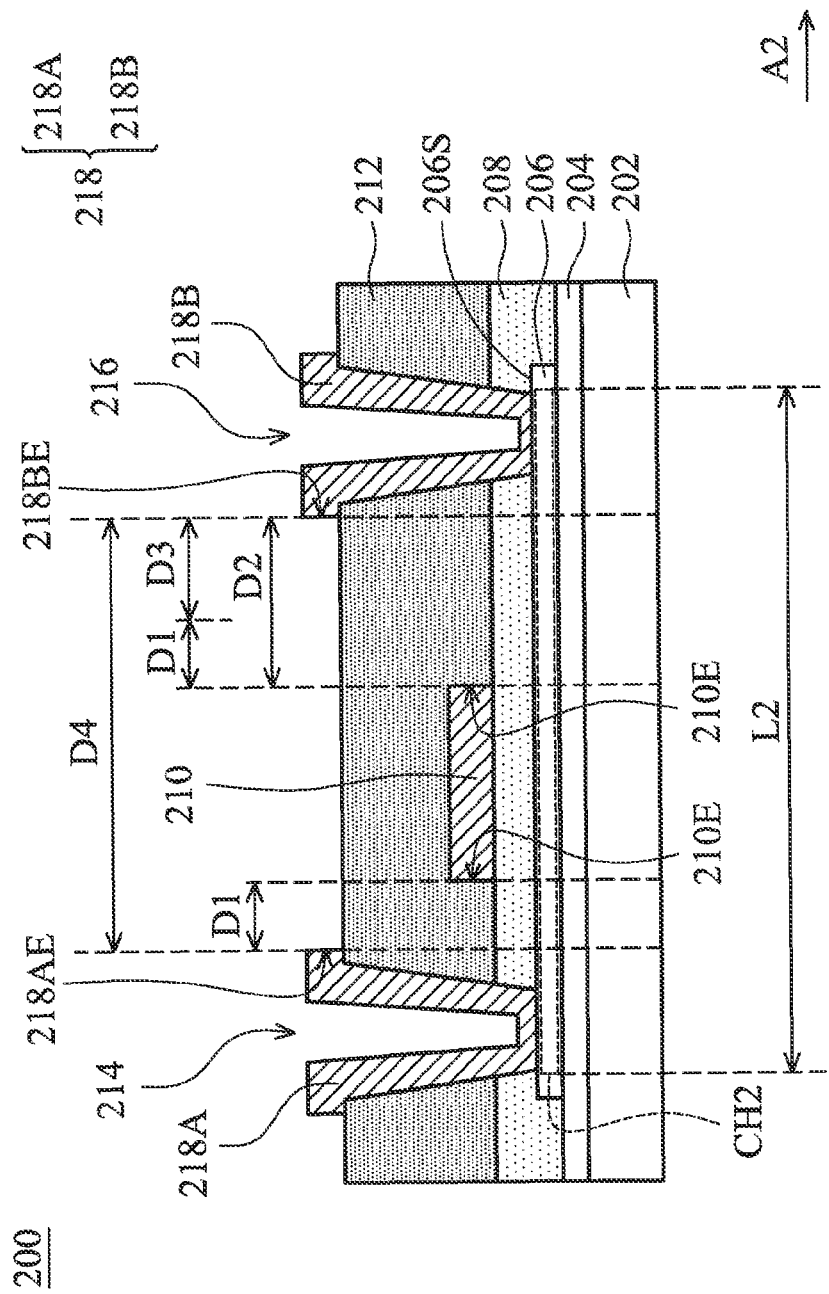
FIG. 2B is a cross-sectional view along line 2B-2B in FIG. 2A.

FIGS. 2A-2B illustrate an active element 200 in accordance with some embodiments of the present disclosure. FIG. 2A is a top view of the active element 200, and FIG. 2B is a cross-sectional view along line 2B-2B in FIG. 2A. The active element 200 is disposed on the non-display region of the thin film transistor substrate. In particular, the active element 200 may be disposed in the gate-driving circuit 60 and/or the source-driving circuit 70 on the non-display region 40 of the thin film transistor substrate 10 shown in FIG. 1A. In one embodiment, the active element 200 is a thin film transistor 200.

The active element 200 may include the buffer layer 204 disposed over the substrate 202 and the semiconductor layer 206 disposed over the buffer layer 204. The substrate 202 is the substrate 20 shown in FIG. 1A. The substrate 202 may include, but is not limited to, a transparent substrate such as a glass substrate, a ceramic substrate, a plastic substrate, or any other suitable transparent substrate. The buffer layer 204 may improve the film quality of the semiconductor layer 206. The buffer layer 204 may include, but is not limited to, silicon oxide, silicon nitride, silicon oxynitride, or a combination thereof. The semiconductor layer 206 may include, but is not limited to, an element semiconductor such as silicon or germanium with single-crystal structure, polycrystal structure or amorphous structure, a compound semiconductor which may include amorphous silicon, polycrystalline silicon, indium gallium zinc oxide, gallium nitride, silicon carbide, gallium arsenic, gallium phosphide, indium phosphide, indium arsenide or indium antimonide, an alloy semiconductor which may include SiGe alloy, GaAsP alloy, AlInAs alloy, AlGaAs alloy, GaInAs alloy, GaInP alloy and/or GaInAsP alloy, or a combination thereof.

In addition, the active element 200 further includes a first insulating layer 208 disposed over the semiconductor layer 206, a first metal layer 210 disposed over the first insulating layer 208 and a second insulating layer 212 disposed over the first metal layer 210.

The first insulating layer 208 serves as a gate dielectric layer and may include, but is not limited to, silicon oxide, silicon nitride, silicon oxynitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr)$TiO_3$ (BST), $Al_2O_3$, any other suitable high-k dielectric material, or a combination thereof. The gate dielectric layer may be formed by chemical vapor deposition or spin-on coating. The chemical vapor deposition may include, but is not limited to, low pressure chemical vapor deposition (LP-CVD), low temperature chemical vapor deposition (LTCVD), rapid thermal chemical vapor deposition (RTCVD), plasma enhanced chemical vapor deposition (PECVD), atomic layer deposition (ALD), or any other suitable method.

The first metal layer 210 serves as a gate electrode and may include, but is not limited to, copper, aluminum, molybdenum, tungsten, titanium, tantalum, platinum, or hafnium. The material of the gate electrode may be formed by the previously described chemical vapor deposition (CVD), sputtering, resistive thermal evaporation, electron beam evaporation, or any other suitable method.

The second insulating layer 212 serves as an interlayer dielectric layer between the first metal layer 210 (gate electrode) and the subsequent second metal layer 218 (serving as a source electrode and/or a drain electrode). The second insulating layer 212 may include, but is not limited to, silicon oxide, silicon nitride, silicon oxynitride, high-k material, any other suitable dielectric material, or a combination thereof. In one preferred embodiment, the second insulating layer 212 has a planar top surface. The second insulating layer 212 may be formed by the previously described chemical vapor deposition (CVD).

Still referring to FIGS. 2A and 2B, the active element 200 further includes a first via hole series 214S and a second via hole series 216S. The first via hole series 214S and second via hole series 216S are disposed adjacent to the two respective opposite sides of the first metal layer 210 (or the two opposite sides of the first branch portion 210 of the first metal layer). The first via hole series 214S includes a plurality of first via holes 214, and the second via hole series 216S includes a plurality of second via holes 216. The first via holes 214 and second via holes 216 penetrate sequentially through the second insulating layer 212 and the first insulating layer 208 and expose the surface 206S of the semiconductor layer 206 as shown in FIG. 2B. The first via holes 214 and second via holes 216 are defined by the sidewall of the first insulating layer 208, the sidewall of the second insulating layer 212, and the surface 206S of the semiconductor layer 206. As illustrated in FIG. 2A, the plurality of first via holes 214 are spaced equally, and the plurality of second via holes 216 are also spaced equally.

Still referring to FIGS. 2A and 2B, the active element 200 further includes a second metal layer 218 disposed over the second insulating layer 212 and filling into the first via holes 214 and second via holes 216. In particular, the second metal layer 218 includes a first portion 218A and a second portion 218B. The first portion 218A and second portion 218B are disposed adjacent to the two respective opposite sides of the first metal layer 210 (or the two respective opposite sides of the first branch portion 210 of the first metal layer). The first portion 218A and second portion 218B may serve as the source electrode and the drain electrode. For example, in one embodiment, the first portion 218A serves as a source electrode, and the second portion 218B serves as a drain electrode. However, in other embodiments, the first portion 218A serves as a drain electrode, and the second portion 218B serves as a source electrode. The semiconductor layer 206 beneath the first metal layer 210 (serving as gate electrode) has a channel CH2 between the first portion 218A and second portion 218B of the second metal layer 218 (serving as source electrode and the drain electrode). The length of the channel CH2 is length L2.

Still referring to FIGS. 2A and 2B, the first portion 218A of the second metal layer 218 is disposed corresponding to one of the first via hole series 214S and is filled into the plurality of first via holes 214 to electrically connect the semiconductor layer 206. The second portion 218B of the second metal layer 218 is disposed corresponding to the second via hole series 216S and is filled into the plurality of second via holes 216 to electrically connect the semiconductor layer 206. Specifically, the first portion 218A of the second metal layer 218 covers the sidewall of the first insulating layer 208, the sidewall of the second insulating layer 212 and the surface 206S of the semiconductor layer 206 in the first via holes 214. The second portion 218B of the second metal layer 218 also covers the sidewall of the first insulating layer 208, the sidewall of the second insulating layer 212 and the surface 206S of the semiconductor layer 206 in the second via holes 216. The first portion 218A and second portion 218B of the second metal layer 218 both do not completely fill the first via holes 214 and the second via holes 216. However, it should be noted that in other embodiments, the first portion 218A and second portion 218B of the second metal layer 218 may completely fill the first via holes 214 and the second via holes 216. Therefore, the inventive concept and scope are not limited to the exemplary embodiment shown in FIGS. 2A-2B.

Still referring to FIGS. 2A and 2B, the minimum distance between the edge 218AE of the first portion 218A of the second metal layer 218 and the edge 210E of the first metal layer 210 is the distance D1, and the minimum distance between the edge 218BE of the second portion 218B of the second metal layer 218 and another edge 210E of the first metal layer 210 is the distance D2. The distance D2 is greater than the distance D1. As illustrated in FIG. 2B, the distance D2 is greater than the distance D1 by a distance D3. In other words, the distance D2 is equal to the distance D1 plus the distance D3 (D2=D1+D3).

It should be noted that, since there is a width difference (namely W2−W1 or W4−W3) between the width (namely width W1 or width W3) of the portion of the second metal layer 218 corresponding to one of the via holes and the width (namely width W2 or width W4) of the portion of the second metal layer 218 corresponding to the region between two adjacent via holes, the distances D1 and D2 in FIG. 2A are different from the distances D1 and D2 in FIG. 2B by this width difference (namely W2−W1 or W4−W3). However, since this width difference is far less than the distances D1 and D2, the distances D1 and D2 in FIG. 2A are assumed to be substantially the same as the distances D1 and D2 in FIG. 2B in order to clearly describe the present disclosure.

Still referring to FIG. 2A, the extension direction of the longitudinal axis of the first metal layer 210 which serves as the gate electrode is direction A1, and the direction A2 refers to a direction that is substantially perpendicular or orthogonal to the direction A1. The aforementioned minimum distances D1 refers to the minimum distance between the edge 218AE and the edge 210E along the direction A2. Similarly, the aforementioned minimum distances D2 refer to the minimum distance between the edge 218BE and another edge 210E along the direction A2. More specifically, the edge 218AE and the edge 210E may be projected onto the substrate 202, and the minimum distance between the two projected edges along the direction A2 is the distances D1. Similarly, the edge 218BE and the edge 210E may be projected onto the substrate 202, and the minimum distance between the two projected edges along the direction A2 is the distances D2.

Since the length of the channel CH2 of the present disclosure is increased by the distance D3, the resistance of the device is increased and the current is decreased, which in turn lowers the temperature of the device and improves the reliability and product lifespan of the display device. In particular, the length of the channel CH2 is increased only between the second portion 218B and the first metal layer 210 by the distance D3, and the length of the channel CH2 between the first portion 218A and the first metal layer 210 is kept constant. Therefore, the hot carrier effect may be reduced and the reliability and service life of the display device may be improved.

The distance D2 is greater than the distance D1 by about 0.1 μm to 1.0 μm (i.e. the distance D3), for example about 0.2 μm to 0.7 μm. It should be noted that, if the distance difference (i.e. the distance D3) is too large, for example larger than 1.0 μm, the resistance of the device would be overly increased and the performance of the device would be reduced. However, if the distance difference (i.e. the distance D3) is too small, for example smaller than 0.1 μm, the current cannot be effectively reduced.

Still referring to FIG. 2A, the minimum distance between the edge 218AE of the first portion 218A of the second metal layer 218 and the edge 218BE of the second portion 218B is the distance D4, and the distance D4 is less than the length L3 of the first via hole series 214S. Specifically, the distance D4 refers to the minimum distance between the edge 218AE of the first portion 218A of the second metal layer 218 and the edge 218BE of the second portion 218B. More specifically, the edge 218AE and the edge 218BE may be projected onto the substrate 202, and the minimum distance between the two projected edges along the direction A2 is the distances D4. The aforementioned length L3 of the first via hole series 214S refers to the maximum distance between the edges of two first via holes 214 which are farthest away from each other in the first via hole series 214S along the extension direction A1 of the longitudinal axis of the first metal layer 210. Similarly, the distance D4 is also less than the length L4 of the second via hole series 216S. The length L4 is defined by the method similar to the length L3, and these will not be repeated for the sake of brevity.

In addition, as shown in FIG. 2A, the first metal layer 210 has an arched end portion E1. The first portion 218A of the second metal layer 218 has an arched end portion E2, and the second portion 218B of the second metal layer 218 also has an arched end portion E3. The arched end portion may prevent charge from aggregating at the sharp end of metal, which in turn may reduce the probability that the active element 200 will be damaged by static electricity.

In addition, the width W1 of the portion of the first portion 218A of the second metal layer 218 corresponding to one of the first via holes 214 is less than the width W2 of the portion of the first portion 218A of the second metal layer 218 corresponding to a region between two of the first via holes 214. Similarly, the width W3 of the portion of the second portion 218B of the second metal layer 218 corresponding to one of the second via holes 216 is less than the width W4 of the portion of the second portion 218B of the second metal layer 218 corresponding to a region between two of the second via holes 216. The width variation may further equally distribute the current in the second metal layer 218 and thus may further improve the product lifespan of the display device.

Figure 3:
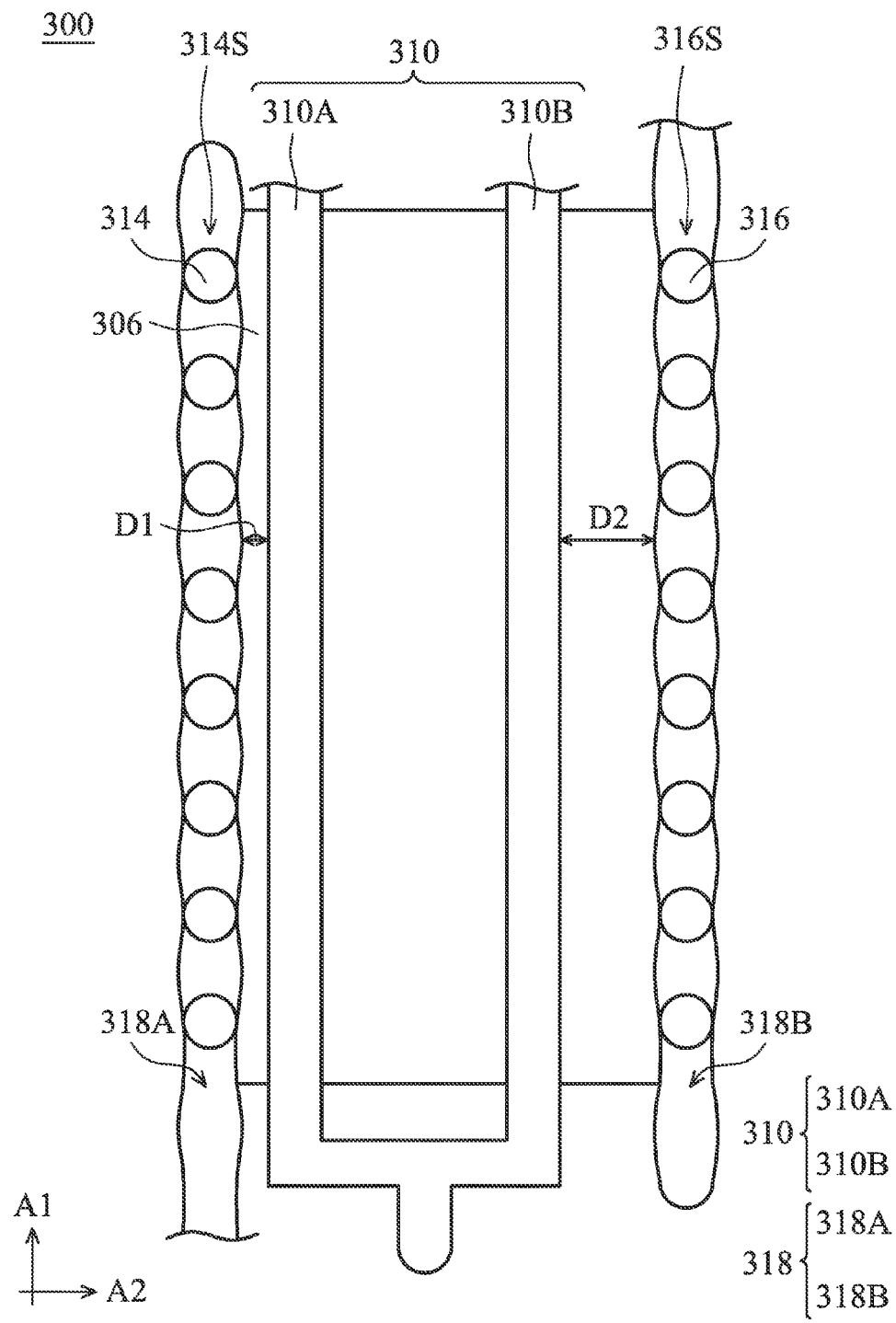
FIG. 3 is a top view of an active element disposed on the non-display region in accordance with another embodiment of the present disclosure.

It should be noted that, although the first metal layer, which serves as the gate electrode, has only one single longitudinal electrode in the embodiments shown in FIGS. 1A-2B, those skilled in the art will appreciate that the first metal layer may have a plurality of longitudinal electrodes as shown in the embodiment in FIG. 3. Therefore, the exemplary embodiments put forth in FIGS. 1A-2B are merely for the purpose of illustration, and the inventive concept may be embodied in various forms without being limited to the exemplary embodiments as shown in FIGS. 1A-2B. Note that the same or similar elements or layers corresponding to those of the display panel are denoted by like reference numerals. The same or similar elements or layers denoted by like reference numerals have the same meaning and will not be repeated for the sake of brevity.

FIG. 3 is a top view of an active element 300 disposed on the non-display region in accordance with another embodiment of the present disclosure. The difference between the embodiment shown in FIG. 3 and the embodiments shown in FIGS. 1A-2B is that the first metal layer 310 includes a first branch portion 310A and a second branch portion 310B. The first branch portion 310A is adjacent to the first portion 318A of the second metal layer 318, and the second branch portion 310B is adjacent to the second portion 318B of the second metal layer 318. The minimum distance between the first branch portion 310A of the first metal layer 310 and the first portion 318A of the second metal layer 318 is the aforementioned distance D1, and the minimum distance between the second branch portion 310B of the first metal layer 310 and the second portion 318B of the second metal layer 318 is the aforementioned distance D2. In addition, there is no second metal layer 318 disposed between the first branch portion 310A and the second branch portion 310B of the first metal layer 310. The first metal layer 310 containing the first branch portion 310A and the second branch portion 310B may have a better ability to control the channel therebeneath.

Figure 4A:
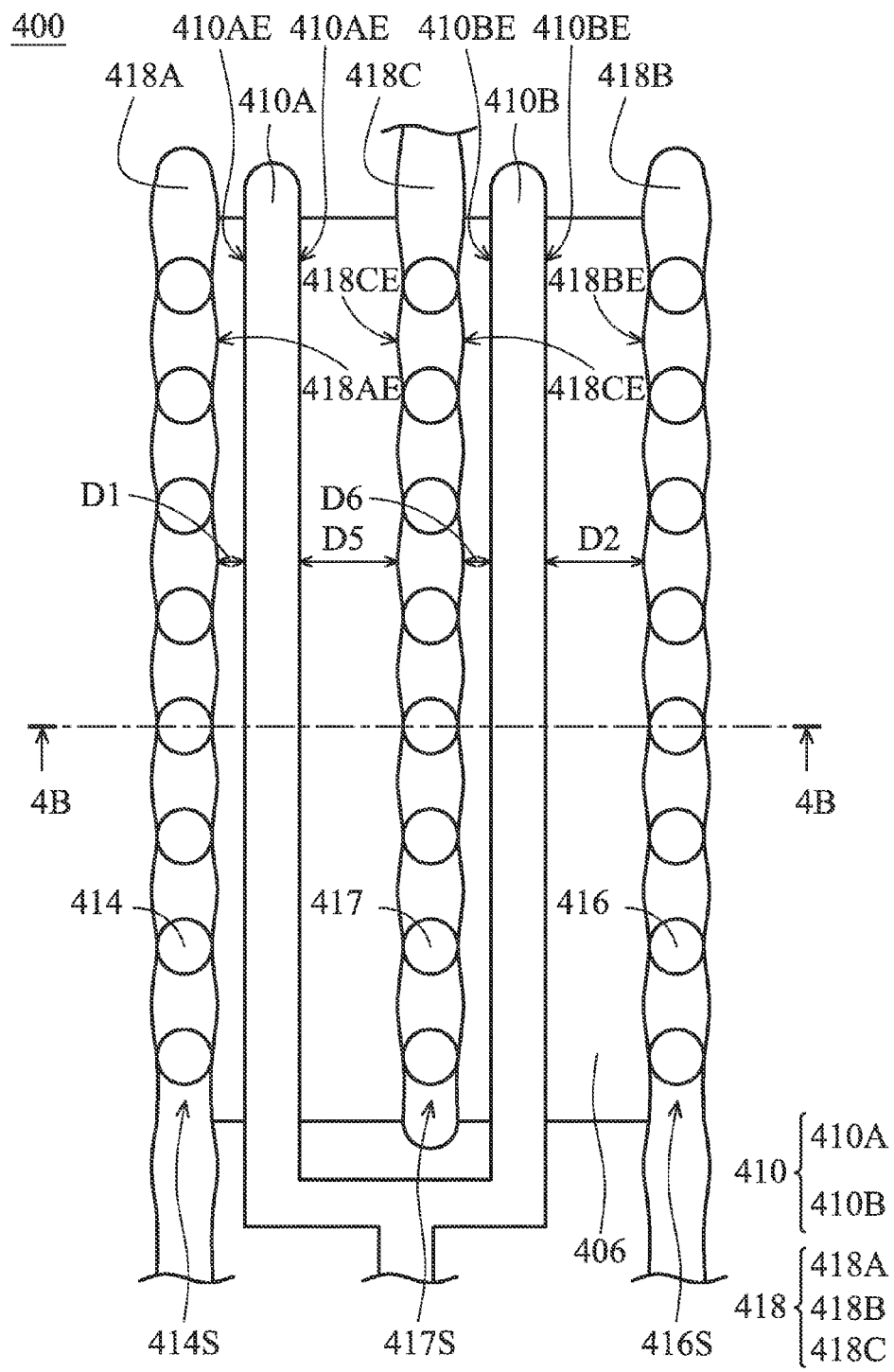
FIG. 4A is a top view of an active element disposed on the non-display region in accordance with yet another embodiment of the present disclosure.
Figure 4B:
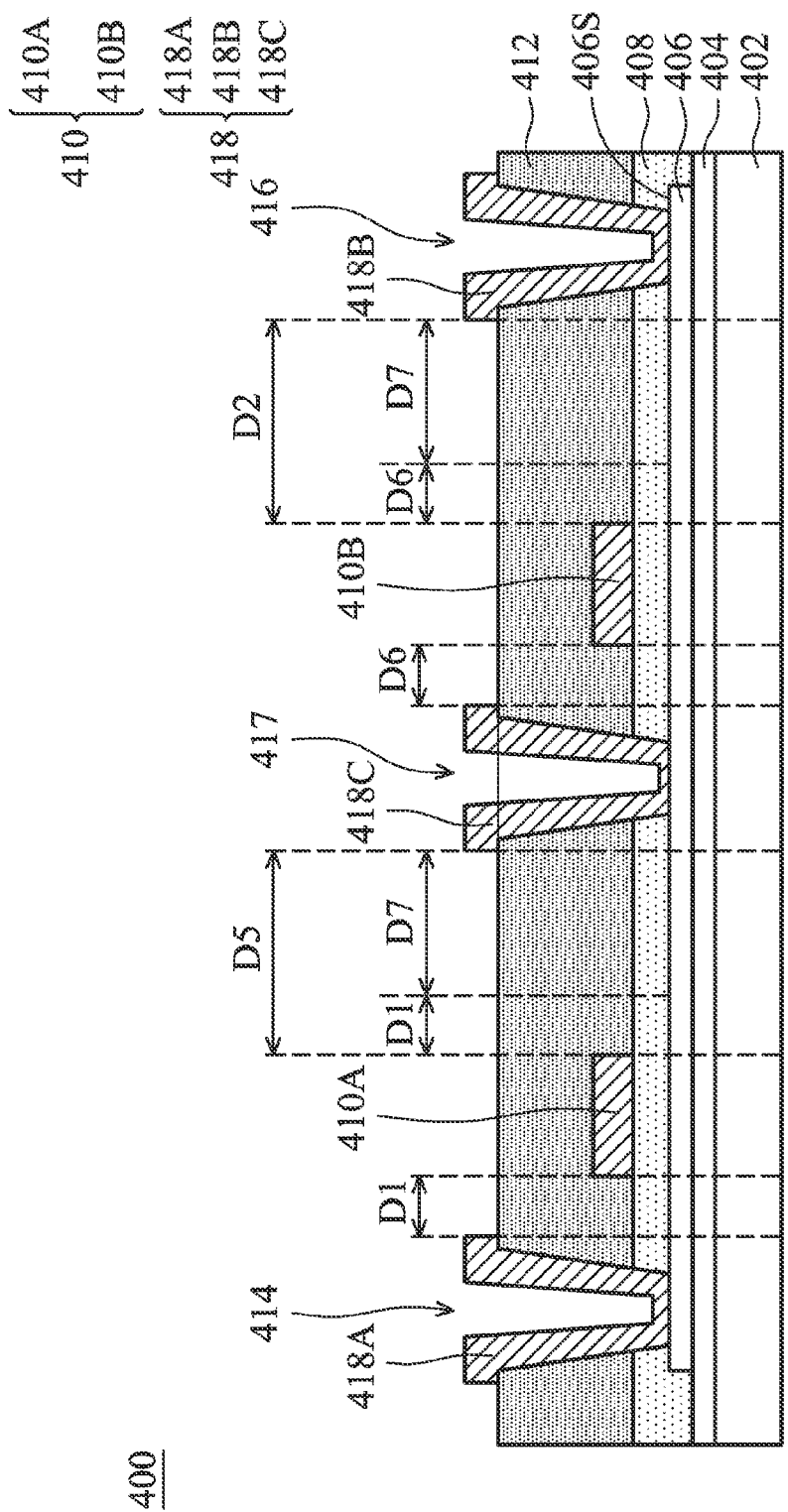
FIG. 4B is a cross-sectional view along line 4B-4B in FIG. 4A.

It should be noted that, although the second metal layer, which serves as the source electrode and/or the drain electrode, has only two portions in the embodiments shown in FIGS. 1A-3, those skilled in the art will appreciate that the second metal layer may have three portions as shown in the embodiment in FIG. 4A-4B. Therefore, the exemplary embodiments put forth in FIGS. 1A-3 are merely for the purpose of illustration, and the inventive concept may be embodied in various forms without being limited to the exemplary embodiments as shown in FIGS. 1A-3.

FIG. 4A is a top view of an active element 400 disposed on the non-display region in accordance with yet another embodiment of the present disclosure, and FIG. 4B is a cross-sectional view along line 4B-4B in FIG. 4A. The difference between the embodiment shown in FIGS. 4A-4B and the embodiments shown in FIGS. 1A-3 is that the second metal layer 418 of the active element 400 includes a first portion 418A, a second portion 418B and a third portion 418C. In addition, the active element 400 includes three via hole series.

In particular, the active element 400 may include the buffer layer 404, the semiconductor layer 406, the first insulating layer 408, the first metal layer 410, the second insulating layer 412 disposed sequentially over the substrate 402. The first metal layer 410 includes the first branch portion 410A and the second branch portion 410B, and the first branch portion 410A and the second branch portion 410B are electrically connected to each other.

In addition, the active element 400 further includes a first via hole series 414S, a second via hole series 416S and a third via hole series 417S. The first via hole series 414S is disposed adjacent to the outer side of the first branch portion 410A of the first metal layer 410. The third via hole series 417S disposed between the first branch portion 410A and the second branch portion 410B. The second via hole series 416S is disposed adjacent to the outer side of the second branch portion 410B of the first metal layer 410, as shown in FIG. 4A. In addition, the first via hole series 414S includes a plurality of first via holes 414, the second via hole series 416S includes a plurality of second via holes 416, and the third via hole series 417S includes a plurality of third via holes 417. The first via holes 414, second via holes 416 and third via holes 417 penetrate sequentially through the second insulating layer 412 and the first insulating layer 408 and expose the surface 406S of the semiconductor layer 406.

Still referring to FIGS. 4A and 4B, the active element 400 further includes a second metal layer 418 disposed over the second insulating layer 412 and filling into the first via holes 414, second via holes 416 and third via holes 417. In particular, the second metal layer 418 includes a first portion 418A, a second portion 418B and a third portion 418C respectively disposed corresponding to the first via hole series 414S, second via hole series 416S and third via hole series 417S. The first portion 418A, second portion 418B, and third portion 418C of the second metal layer 418 are respectively filled into the first via holes 414, second via holes 416, and third via holes 417 to electrically connect to the semiconductor layer 406.

In the active element 400, the first metal layer 410 serves as the gate electrode of the active element 400. The first portion 418A and second portion 418B of the second metal layer 418 serve as one of the source electrode or drain electrode of the active element 400, and the third portion 418C of the second metal layer 418 serves as the other of the source electrode or drain electrode. For example, in one embodiment, the first portion 418A and second portion 418B serve as the source electrode of the active element 400, and the third portion 418C serves as the drain electrode. However, in other embodiments, the first portion 418A and second portion 418B serve as the drain electrode of the active element 400, and the third portion 418C serves as the source electrode.

As shown in FIGS. 4A and 4B, the minimum distance between the edge 418AE of the first portion 418A of the second metal layer 418 and the edge 410AE of the first branch portion 410A of the first metal layer 410 is the distance D1, and the minimum distance between the edge 418CE of the third portion 418C of the second metal layer 418 and the edge 410AE of the first branch portion 410A of the first metal layer 410 is the distance D5. The distance D5 is greater than the distance D1.

Similarly, the minimum distance between the edge 418CE of the third portion 418C of the second metal layer 418 and the edge 410BE of the second branch portion 410B of the first metal layer 410 is the distance D6, and the minimum distance between the edge 418BE of the second portion 418B of the second metal layer 418 and the edge 410BE of the second branch portion 410B of the first metal layer 410 is the distance D2. The distance D2 is greater than the distance D6, and the distance D5 is greater than the distance D6. The distance D5 is greater than the distance D1 by about 0.1 μm to 1.0 μm (i.e. the distance D7), for example about 0.2 μm to 0.7 μm.

It should be noted that, since there is a width difference between the width of the portion of the second metal layer 418 corresponding to the via holes and the width of the portion of the second metal layer 418 corresponding to the region between two adjacent via holes, the distances D1, D2, D5 and D6 in FIG. 4A is different from the distances D1, D2, D5 and D6 in FIG. 4B by this width difference. However, since this width difference is far less than the distances D1, D2, D5 and D6, the distances D1, D2, D5 and D6 in FIG. 4A is assumed to be substantially the same as the distances D1, D2, D5 and D6 in FIG. 4B in order to clearly describe the present disclosure.

In addition, it should be noted that distances D1 and D2 in FIGS. 4A-4B are defined by a similar method as distances D1 and D2 in the embodiment shown in FIGS. 2A-2B, and these will not be repeated for the sake of brevity.

Since the length of the channel of the present disclosure is increased by the distance D7, the resistance of the device is increased and the current is decreased, which in turn lowers the temperature of the device and improves the reliability and service life of the display device. In particular, the length of the channel is increased only between the third portion 418C of the second metal layer 418 and the first branch portion 410A of the first metal layer 410 by the distance D7, and the length of the channel between the first portion 418A of the second metal layer 418 and the first branch portion 410A of the first metal layer 410 is kept constant. Therefore, the hot carrier effect may be reduced and the reliability and product lifespan of the display device may be improved. Similarly, since the length of the channel is increased only between the second portion 418B of the second metal layer 418 and the second branch portion 410B of the first metal layer 410 by the distance D7 and the length of the channel between the third portion 418C of the second metal layer 418 and the second branch portion 410B of the first metal layer 410 is kept constant, the hot carrier effect may also be reduced.

In addition, it is preferred that the source-gate capacitance is equal to the drain-gate capacitance in the active element 400. For example, in one embodiment, the first portion 418A and second portion 418B of the second metal layer 418 serve as the source electrode, and the third portion 418C serves as the drain electrode. The first metal layer 410 including the first branch portion 410A and second branch portion 410B serves as the gate electrode.

A first source-gate capacitance exists between the first portion 418A (serving as the source electrode) and the first branch portion 410A (serving as the gate electrode), and a second source-gate capacitance exists between the second portion 418B (serving as the source electrode) and the second branch portion 410B (serving as the gate electrode). A first drain-gate capacitance exists between the third portion 418C of the second metal layer 418 (serving as the drain electrode) and the first branch portion 410A (serving as the gate electrode), and a second drain-gate capacitance exists between the third portion 418C of the second metal layer 418 (serving as the drain electrode) and the second branch portion 410B (serving as the gate electrode). It is preferred that the sum of the first source-gate capacitance and the second source-gate capacitance is equal to the sum of the first drain-gate capacitance and the second drain-gate capacitance.

Since the source-gate capacitance of the active element 400 is equal to the drain-gate capacitance, the performance of the device may be improved. Specifically, since the source and the drain are defined only by the current direction between the electrodes, all of the first portion 418A, the second portion 418B and the third portion 418C of the second metal layer 418 may serve as the source or the drain. Therefore, if the source-gate capacitance of the active element 400 is equal to the drain-gate capacitance, there will be no error resulting from the capacitance difference when the first portion 418A, second portion 418B and third portion 418C are altered between source and drain. Therefore, the performance of the device may be improved.

Figure 5:
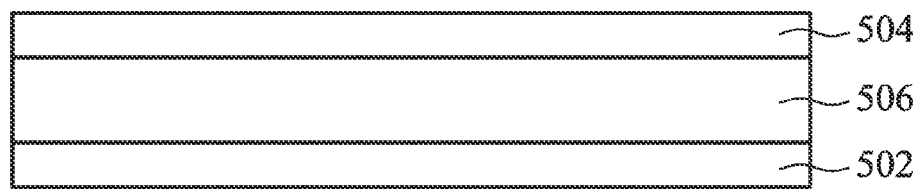
FIG. 5 is a cross-sectional view of a display panel in accordance with some embodiments of the present disclosure.

In addition, the present disclosure also provides a display panel containing the aforementioned thin film transistor substrate which includes the aforementioned active element. FIG. 5 is a cross-sectional view of a display panel 500 in accordance with some embodiments of the present disclosure. As shown in FIG. 5, the display panel 500 includes a thin film transistor substrate 502, an upper substrate 504 and a display medium layer 506. In the embodiment of the present disclosure, the display panel 500 may be a liquid-crystal display panel. The upper substrate 504 may include a color filter substrate. The display medium layer 506 may include a liquid crystal layer. In other embodiments of the present disclosure, the display panel 500 may be an organic light-emitting display panel. The upper substrate 504 may include a transparent substrate and the display medium layer 506 may include an organic light-emitting layer. In yet another embodiment of the present disclosure, the display panel 500 may be an organic light-emitting display panel. The upper substrate 504 may include a color filter substrate and the display medium layer 506 may include an organic light-emitting layer.

The active element 200 in the embodiment shown in FIGS. 2A-2B, the active element 300 in the embodiment shown in FIG. 3, or the active element 400 in the embodiment shown in FIGS. 4A-4B may be disposed on the non-display region of the thin film transistor substrate 502. The upper substrate (a color filter substrate) 504 may include a transparent substrate and a color filter layer (not shown) disposed over the transparent substrate. The color filter layer may include, but is not limited to, a red color filter layer, a green color filter layer, a blue color filter layer, or any other suitable color filter layer. The liquid-crystal layer 506 may include, but is not limited to, nematic liquid crystal, smectic liquid crystal, cholesteric liquid crystal, blue phase liquid crystal, or any other suitable liquid-crystal layer.

Since the active elements 200, 300 or 400 disposed in the thin film transistor substrate 502 may increase the resistance and decrease the current of the device, the temperature of the device may be decreased and the hot carrier effect may be reduced. Therefore, the reliability and product lifespan of the display panel 500 may be improved.

Figure 6:
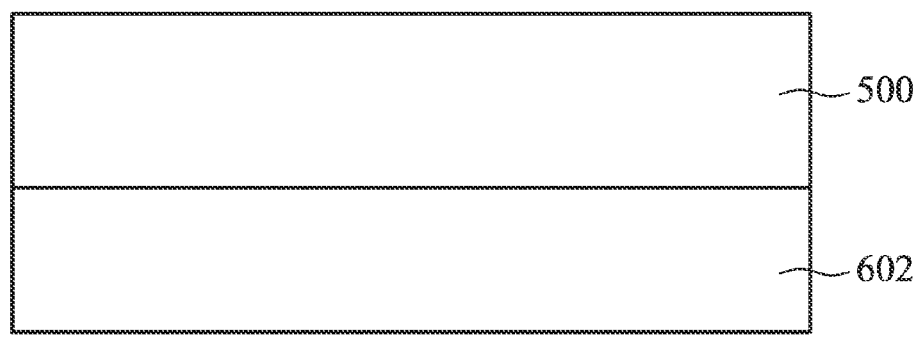
FIG. 6 is a cross-sectional view of a display device in accordance with some embodiments of the present disclosure.

In addition, the present disclosure also provides a display device manufactured by the display panel. FIG. 6 is a cross-sectional view of a display device 600 in accordance with some embodiments of the present disclosure. As shown in FIG. 6, display device 600 includes a backlight module 602 and the display panel 500 disposed over the backlight module 602. The backlight module 602 may include, but is not limited to, a light-emitting diode backlight module or any other suitable backlight module. It should be noted that, if the display panel 500 is a organic light-emitting display panel, the backlight module is not necessary and may be eliminated. Since the active elements in the display panel 500 may increase the resistance and decrease the current of the device, the temperature of the device may be decreased and the hot carrier effect may be reduced. Therefore, the reliability and product lifespan of the display device 600 may be improved.

In summary, in the embodiment of the present disclosure, since the distance between the source and the gate is different from the distance between the drain and the gate in the thin film transistor disposed on the non-display region, the resistance of the device may be increased and the current may be decreased such that the temperature of the device may be decreased and the hot carrier effect may be reduced. Therefore, the reliability and product lifespan of the display device may be improved.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display panel, comprising:
a substrate comprising a display region and a non-display region adjacent to the display region;
a thin film transistor disposed on the non-display region of the substrate, wherein the thin film transistor comprises:
a semiconductor layer disposed over the substrate;
a first insulating layer disposed over the semiconductor layer;
a first metal layer disposed over the first insulating layer;
a second insulating layer disposed over the first insulating layer;
a first via hole series and a second via hole series disposed adjacent to respective opposite sides of the first metal layer, wherein the first via hole series comprises a plurality of first via holes, and the second via hole series comprises a plurality of second via holes;
a second metal layer disposed over the second insulating layer, wherein the second metal layer comprises a source electrode and a drain electrode, wherein the source electrode electrically connects the semiconductor layer through the plurality of first via holes, and the drain electrode electrically connects the semiconductor layer through the plurality of second via holes, wherein a minimum distance between an edge of the source electrode and an edge of the first metal layer is a first distance, and a minimum distance between an edge of the drain electrode and another edge of the first metal layer is a second distance, and the second distance is different from the first distance.

2. The display panel as claimed in claim 1, wherein the second distance is greater than the first distance by about 0.1 μm to 1.0 μm.

3. The display panel as claimed in claim 1, wherein a minimum distance between the edge of the source electrode and the edge of the drain electrode is a third distance, and the third distance is less than a length of the first via hole series.

4. The display panel as claimed in claim 1, wherein the first metal layer comprises an arched end portion.

5. The display panel as claimed in claim 1, wherein a width of a portion of the second metal layer corresponding to one of the first via holes is less than a width of a portion of the second metal layer corresponding to a region between two of the first via holes.

6. The display panel as claimed in claim 1, wherein the plurality of first via holes are spaced equally, and the plurality of second via holes are spaced equally.

7. The display panel as claimed in claim 1, wherein the first metal layer comprises a first branch portion and a second branch portion, wherein the first branch portion is adjacent to the source electrode of the second metal layer, and the second branch portion is adjacent to the drain electrode of the second metal layer.

8. The display panel as claimed in claim 7, wherein each of the first branch portion and the second branch portion of the first metal layer comprises an arched end portion.

9. The display panel as claimed in claim 7, wherein the first branch portion and the second branch portion of the first metal layer are electrically connected to each other.

10. The display panel as claimed in claim 7, wherein a minimum distance between the first branch portion and the source electrode of the second metal layer is the first distance, and a minimum distance between the second branch portion and the drain electrode of the second metal layer is the second distance.

11. The display panel as claimed in claim 10, wherein the display panel further comprises a third via hole series disposed between the first branch portion and the second branch portion of the first metal layer, wherein the third via hole series comprises a plurality of third via holes, and the plurality of third via holes are defined by the sidewall of the first insulating layer, the sidewall of the second insulating layer and the surface of the semiconductor layer;
the second metal layer further comprises a third portion, wherein the third portion electrically connects the semiconductor layer through the plurality of third via holes,
wherein a minimum distance between an edge of the third portion and an edge of the first branch portion is a third distance, and a minimum distance between another edge of the third portion and an edge of the second branch portion is a fourth distance, and the third distance is greater than the fourth distance.

12. The display panel as claimed in claim 11, wherein the third distance is greater than the fourth distance by about 0.1 μm to 1.0 μm.

13. The display panel as claimed in claim 11, wherein the second distance is greater than the fourth distance, and the third distance is greater than the first distance.

14. The display panel as claimed in claim 11, wherein a minimum distance between the edge of the drain electrode and the edge of the third portion is a fifth distance, and the fifth distance is less than a length of the third via hole series.

15. The display panel as claimed in claim 11, wherein a width of a portion of the second metal layer corresponding to one of the third via holes is less than a width of a portion of the second metal layer corresponding to a region between two of the third via holes.

16. The display panel as claimed in claim 1, further comprising:
a color filter substrate; and
a liquid crystal layer disposed between the substrate and the color filter substrate.

17. The display panel as claimed in claim 1, further comprising:
an upper substrate; and
an organic light-emitting layer disposed between the substrate and the upper substrate.

18. A display panel, comprising:
a substrate comprising a display region and a non-display region adjacent to the display region;
a thin film transistor disposed on the non-display region of the substrate, wherein the thin film transistor comprises:
a semiconductor layer disposed over the substrate;
a first insulating layer disposed over the semiconductor layer;
a first metal layer disposed over the first insulating layer, comprising a first branch portion and a second branch portion;
a second insulating layer disposed over the first insulating layer;
a first via hole series and a second via hole series disposed adjacent to respective opposite sides of the first metal layer, wherein the first via hole series comprises a plurality of first via holes, and the second via hole series comprises a plurality of second via holes;
a second metal layer disposed over the second insulating layer, wherein the second metal layer comprises a first portion adjacent to the first branch portion and a second portion adjacent to the second branch portion, wherein the first portion electrically connects the semiconductor layer through the plurality of first via holes, and the second portion electrically connects the semiconductor layer through the plurality of second via holes,
wherein a minimum distance between an edge of the first portion and an edge of the first branch portion is a first distance, and a minimum distance between an edge of the second portion and an edge of the second branch portion is a second distance, and the second distance is greater than the first distance.

* * * * *